(12) United States Patent
Abdelli

(10) Patent No.: US 7,113,755 B2
(45) Date of Patent: *Sep. 26, 2006

(54) PASSIVE MIXER WITH IMPROVED LINEARITY

(75) Inventor: Said E. Abdelli, Minneapolis, MN (US)

(73) Assignee: Honeywell International, Inc., Morristown, NJ (US)

(*) Notice: Subject to any disclaimer, the term of this patent is extended or adjusted under 35 U.S.C. 154(b) by 477 days.

This patent is subject to a terminal disclaimer.

(21) Appl. No.: 10/644,630

(22) Filed: Aug. 19, 2003

(65) Prior Publication Data

US 2005/0043003 A1 Feb. 24, 2005

(51) Int. Cl.
*H01Q 11/12* (2006.01)
*H04B 1/04* (2006.01)
*H04B 1/28* (2006.01)

(52) U.S. Cl. .................. 455/118; 455/326; 455/333

(58) Field of Classification Search ........ 455/313–315, 455/318–319, 323–326, 333, 118; 327/113
See application file for complete search history.

(56) References Cited

U.S. PATENT DOCUMENTS 6,847,808 B1* 1/2005 Zhou ................ 455/189.1
6,972,610 B1* 12/2005 Behzad .................. 327/359
2004/0043741 A1* 3/2004 Goddard et al. .......... 455/313
2005/0221775 A1* 10/2005 Abdelli .................. 455/189.1

OTHER PUBLICATIONS

RF Microelectronics by Behzad Razavi, © Prentice Hall, pp. 14-25, 1998.
A 1-GHz CMOS UP-Conversion Mixer, Peter R. Kinget et al, IEEE Journal of Solid-State Circuits, vol. 32, No. 3, pp. 370-376, Mar. 1997.

* cited by examiner

*Primary Examiner*—Nguyen T. Vo
(74) *Attorney, Agent, or Firm*—McDonnell Boehnen Hulbert & Berghoff LLP

(57) ABSTRACT

A mixer circuit in accordance with an embodiment of the invention includes a first mixer stage including first and second transmission gates, and a second mixer stage including third and fourth transmission gates. The mixer further includes a first base band signal terminal coupled with the first and second transmission gates and a second base band signal terminal coupled with the third and fourth transmission gates. The mixer circuit processes signals so as to mix a base band signal communicated to the first and second base band signal terminals with a differential LO signal communicated to first and second LO signal terminals to create a first mixed differential signal. Alternatively, the mixer extracts a base band signal from a mixed signal communicated to the first and second mixed signal terminals signal using the LO signal communicated to the first and second LO signal terminals.

28 Claims, 3 Drawing Sheets

PASSIVE MIXER WITH IMPROVED LINEARITY

FIELD

The present invention relates to mixer circuits and, more specifically, to passive mixer circuits.

BACKGROUND

Mixer circuits are commonly used in a number of applications. As one example, they are often used in radio frequency (RF) applications for up-converting (up-mixing) or down-converting (down-mixing). In this context, up-converting is the process of mixing a base band signal, such as a differential base band signal, with an RF signal, such as a differential RF signal that is generated by a local oscillator circuit that operates in the RF range. This process generates a mixed RF signal with the base band information included with (mixed with) the RF signal generated by the local oscillator. Down-converting is the process of separating (un-mixing) the base band signal from the mixed RF signal. This is typically accomplished by using a mixer circuit with a local oscillator of substantially an identical frequency as was used to mix the mixed RF signal.

One typical type of mixer circuit is a passive mixer circuit, which may be implemented using a complementary-metal-oxide semiconductor circuit fabrication process (e.g. an integrated circuit). In such circuits, the operation of such mixer circuits is dependent on the linear range of those circuits. In this respect, the linear range of the circuit affects the one decibel (1 dB) compression point and the third intercept point (IP3), which are measures of the adverse affects of non-linearities on the gain and performance of such circuits. In this respect, current approaches for implementing passive mixer circuits have certain limitations. These limitations include included limited linear ranges, which result in 1 db compression points and IP3 points that are unacceptable for RF signals with higher amplitudes (e.g. these circuits have insufficient gain when processing such signals). Therefore, alternative approaches for implementing such circuits are desirable.

SUMMARY

A mixer circuit in accordance with the invention includes a first mixer stage comprising a first transmission gate and a second transmission gate. The first transmission gate is coupled with a first MIXED signal terminal and first and second local oscillator (LO) signal terminals. The second transmission gate is coupled with a second MIXED signal terminal and the first and second LO signal terminals. The mixer further includes a second mixer stage comprising a third transmission gate and a fourth transmission gate. The third transmission gate is coupled with the first MIXED signal terminal and the first and second local oscillator signal terminals so as to operate out of phase with the first transmission gate. The fourth transmission gate is coupled with the second MIXED signal terminal and the first and second local oscillator signal terminals so as to operate out of phase with the second transmission gate.

The mixer still further includes a first base band signal terminal coupled with the first and second transmission gates and a second base band signal terminal coupled with the third and fourth transmission gates. The mixer circuit processes signals so as to mix a base band signal communicated to the first and second base band signal terminals with a differential LO signal communicated to the first and second LO signal terminals to create a first mixed differential signal. Alternatively, the mixer extracts a base band signal from a mixed signal communicated to the first and second mixed signal terminals signal using the LO signal communicated to the first and second LO signal terminals.

BRIEF DESCRIPTION OF THE DRAWINGS

The subject matter regarded as the invention is particularly pointed out and distinctly claimed in the concluding portion of the specification. The invention, however, as to both organization and method of operation, together with features and advantages thereof, may best be understood by reference to the following detailed description when read with the accompanying drawings in which:

DETAILED DESCRIPTION

In the following detailed description, numerous specific details are set forth in order to provide a thorough understanding of the invention. However, it will be understood that the present invention may be practiced without these specific details. In other instances, well-known methods, procedures, components and circuits have not been described in detail, so as not to obscure the present invention.

For purposes of this disclosure, the embodiments discussed herein are described in the context of radio frequency (RF) circuits. However, it will be appreciated that using such mixer circuits for RF applications is only one of any number of applications that are possible. For example, such circuits may be used as part of an analog to digital converter or a limiter, as two possibilities.

Figure 1:
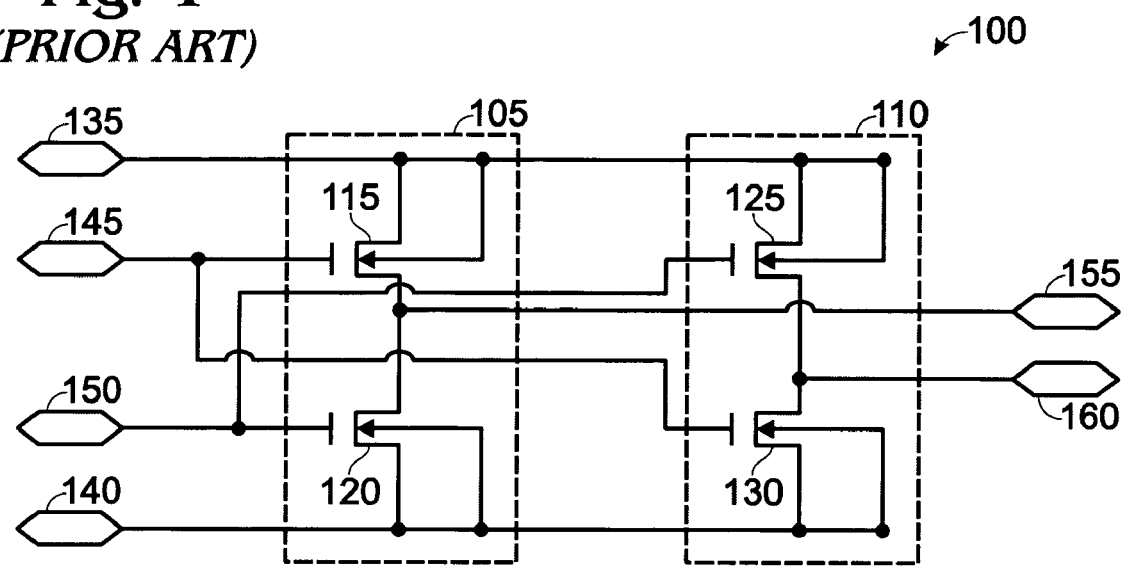
FIG. 1 is a schematic diagram illustrating a prior art embodiment of a differential mixer circuit.

Referring now to FIG. 1, a schematic diagram of a prior art complementary-metal-oxide semiconductor (CMOS) passive mixer circuit 100 is shown. The mixer 100 comprises a first stage 105 and a second stage 110. Each stage comprises two n-type field effect transistors (FETs). In this regard, the first mixer stage 105 comprises FETs 115 and 120. The second stage 110 comprises FETs 125 and 130. The mixer 100 also comprises radio frequency (RF) mixed signal terminals 135 and 140 and local oscillator (LO) signal terminals 145 and 150. The RF mixed signal terminals 135 and 140 are used to communicate RF mixed signals to and/or from the mixer 100, such as for use in a radio receiver, transmitter and/or transceiver. The LO signal terminals 145 and 150 are used to supply a LO signal to the mixer 100 for use in up-converting and/or down-converting signals processed by the mixer 100. The mixer 100 further comprises base band signal terminals 155 and 160, which are used to communicate base band signals (e.g. voice) to and/or from the mixer 100. As was noted above, while this disclosure is generally directed to RF applications, it will be appreciated that other applications for such mixer circuits exist.

The RF, LO and base band signals that are typically employed with mixer 100 are differential signals, with opposite phases of such signals being communicated on each of the respective differential signal terminal pairs. (RF 135/140; LO 145/150; and base band 155/160). A mixed RF signal is generated by the mixer 100 by communicating a differential base band signal to the mixer 100 via the base band signal terminals 155 and 160 and communicating a differential LO signal to the mixer 100 via the LO signal terminal 145 and 150. The differential LO signal, for RF applications, is a signal having a frequency in the RF range, which is known. The differential base band signal is typically a signal in the kilohertz range, such as a signal corresponding to a human voice.

The LO signal and the base band signal are then mixed (e.g. up-converted) by generating a mixed RF differential signal that may be communicated external to the mixer 100 via the RF signal terminals 135 and 140. The mixed RF signal may then be communicated to, for example, an antenna for airborne transmission, such as from one handheld two-way radio to another. The mixed signal is generated as the result of the base band signal being conducted by the FETs 115–103 of the first and second mixer stages 105 and 110 in dependence on the LO signals applied to the gates of those FETs.

The mixer 100 may also extract a base band signal from a previously mixed RF signal, as has been previously indicated. In this situation, the mixer 100 receives the mixed RF signal via the RF signal terminals 135 and 140. The LO signal is also communicated to the mixer 100 via the LO signal terminals 145 and 150. The first and second mixer stages (105 and 110) then process the received mixed RF signal with the LO signal to extract the base band signal. The base band signal is then communicated via the base band signal terminals 155 and 160. The base band signal may, in certain embodiments, then be communicated to an audio processing circuit (not shown) for playback, such as in a handheld two-way radio or a radio receiver.

However, as was previously indicated, the mixer 100 has certain limitations. As the signals processed by the mixer 100 become larger in amplitude (e.g. the base band signal and/or the RF signal) the gate to source voltage ($V_{gs}$) of the FETs 115–130 is reduced, causing the channel resistance of the FETs 115–130 to increase. The FETs 115–130, in this situation, are operating outside their linear region. Such a situation is undesirable because the mixer 100 becomes more susceptible to noise, which may be introduced into the mixed RF signal and/or base band signal due to the transistor resistance being increased due to the reduction in $V_{gs}$.

In this situation, the 1 db compression point and/or the IP3 point of such a mixer circuit may be lower than is desirable for processing certain signals. Additionally, such an increase in the conduction resistance of the FETs 115–130 may result in the introduction of harmonic noise by mixer 100 to the RF (e.g. mixed signals) and/or base band signals being processed by the mixer 100. Therefore, based on the foregoing, other approaches for implementing a passive mixer circuit are desirable.

Figure 2:
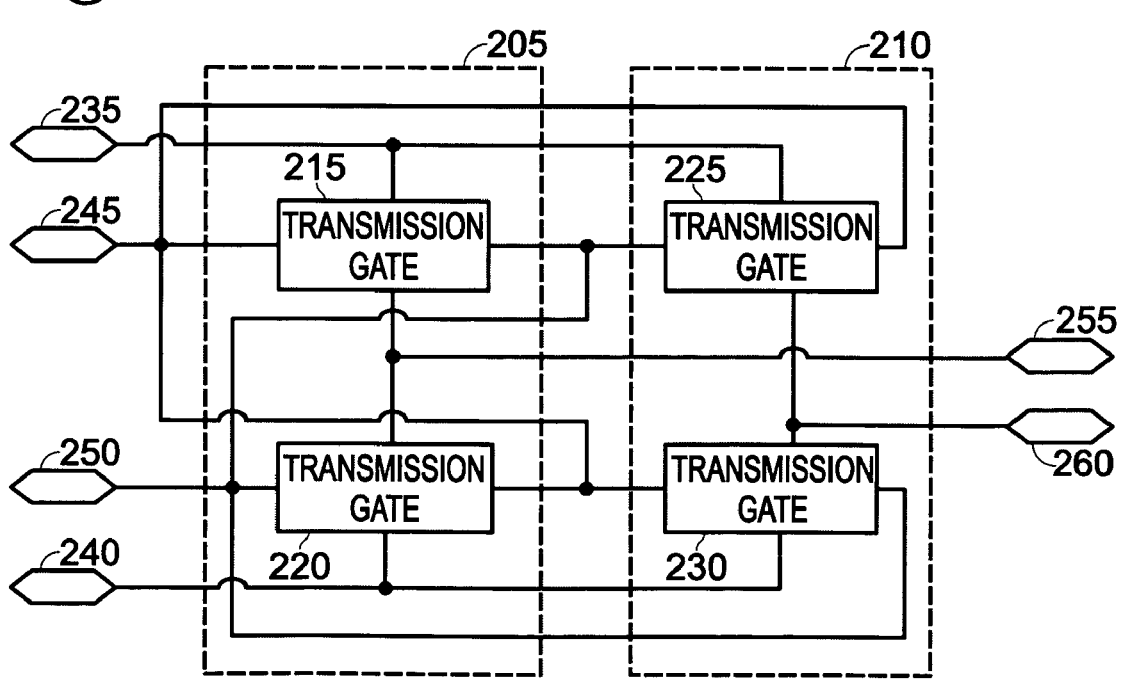
FIG. 2 is a schematic/block diagram illustrating a mixer circuit in accordance with an embodiment of the invention.

Referring now to FIG. 2, a schematic/block diagram of a mixer circuit 200 in accordance with an embodiment of the invention is shown. The mixer circuit 200 may be implemented in any number of ways. In this regard, the mixer 200 may be implemented as an integrated circuit, such as a CMOS integrated circuit. Of course other methods of implementing the mixer 200 exist, such as using other types of semiconductor processing, or by using discrete components, for example.

The mixer 200 comprises a first mixer stage 205 and a second mixer stage 210. The first mixer stage 205 comprises a first transmission gate 215 and a second transmission gate 220. The second mixer stage comprises a third transmission gate 225 and a fourth transmission gate 230. For the mixer 200 the first transmission gate 215 is coupled with the third transmission gate 225 in a first "circuit path" and the second transmission gate 220 is coupled with the fourth transmission gate 230 in a second "circuit path." In this respect, such a configuration may address at least some of the disadvantages of the mixer 100 shown in FIG. 1 and described above. Such improvements result, at least in part, from an increase in the linear range of such a mixer circuit due to the use of the transmission gates 215–230. These improvements will be discussed further with respect to FIGS. 3 and 4.

The mixer 200 further comprises differential mixed signal terminals 235 and 240. The mixed signal terminal 235 is coupled with the first transmission gate 215 and the third transmission gate 225. The mixed signal terminal 240 is coupled with the second transmission gate 220 and the fourth transmission gate 230.

The mixer 200 still further comprises a first LO signal terminal 245 and a second LO signal terminal 250 that are coupled with the first, second, third and fourth transmission gates 215–230. The LO signal terminals 245 and 250 are coupled with the transmission gates 215–230, such that the first transmission gate 215 and the second transmission gate 220 operate 180 degrees out of phase with, respectively, the third transmission gate 225 and the fourth transmission gate 230. The operation of such a circuit will be discussed in more detail with respect to FIG. 3.

The mixer 200 still further includes a first base band signal terminal 255 coupled with the first and second transmission gates (215 and 220) and a second base band signal terminal 260 coupled with the third and fourth transmission gates (225 and 230). The base band signal terminals 255 and 260 may be used to communicate a differential base band signal to the mixer 200 to be mixed with a LO signal and/or to communicate an extracted base band signal from the mixer 200 to other circuitry, such as an audio circuit, as was indicated earlier.

Figure 3:
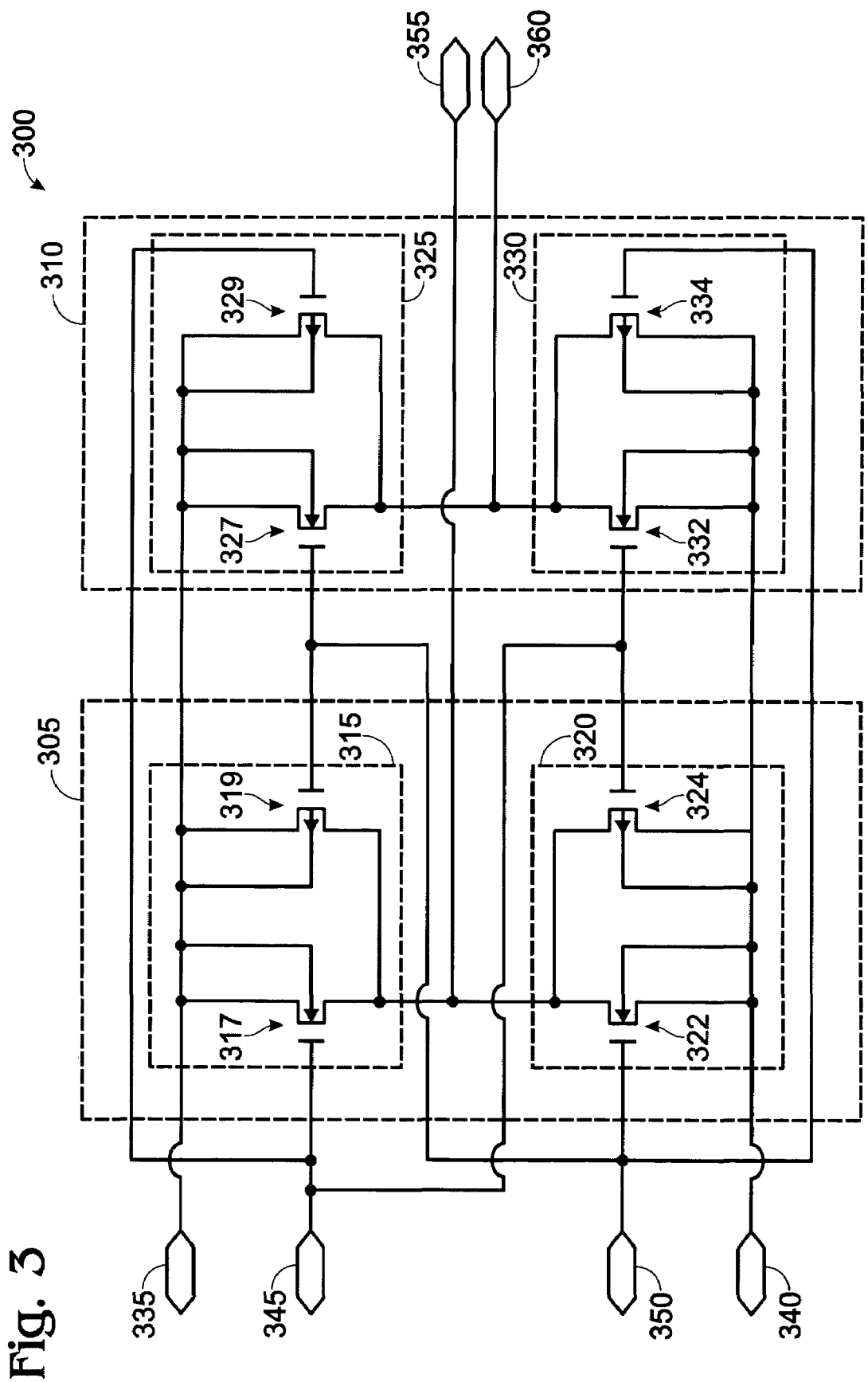
FIG. 3 is a schematic diagram illustrating another mixer circuit in accordance with an another embodiment of the invention.

Referring now to FIG. 3, a schematic diagram of a mixer circuit 300 according to another embodiment of the invention is shown. It is noted that the mixer circuit 300 contains analogous elements to the mixer circuit 200 shown in FIG. 2. In this regard, elements of the mixer 300 that are analogous to those of the mixer 200 have been referenced with corresponding 300 series reference numerals. For example, while the first stage of the mixer 200 is referenced as 205, a first stage of the mixer 300 is referenced as 305. This convention is consistent throughout FIG. 3. For the sake of brevity, these analogous elements will only be described, with respect to FIG. 3, to describe the function of the mixer 300 with respect to the additional detail of the transmission gates 315, 320, and 330.

In this regard, the transmission gates 315, 320, 325 and 330 of the mixer 300 comprise CMOS transmission gates, each having an n-type field-effect transistor (FET), respectively 317, 322, 327 and 332; and a p-type FET, respectively 319, 324, 329 and 334. Each n-type FET has a source terminal and a drain terminal coupled, respectively, with a source terminal and a drain terminal of its corresponding p-type FET. Further, the source terminals of the n-type FETs 317 and 327 and the p-type FETs 319 and 329 of the first transmission gate 315 and the third transmission gate 325 are coupled with the first mixed signal terminal 335. Likewise, the source terminals of the n-type FETs 322 and 332 and p-type FETs 324 and 334 of the second transmission gate 320 and the fourth transmission gate 330 are coupled with the second mixed signal terminal 340.

As is shown in FIG. 3, gate terminals of the n-type FETs 317 and 332 of, respectively, the first transmission gate 315 and the fourth transmission gate 330, and gate terminals of the p-type FETs 324 and 329 of, respectively, the second transmission gate 320 and the third transmission gate 325 are coupled with the first LO signal terminal 345. Likewise, gate terminals of the n-type FETs 322 and 327 of, respectively, the second transmission gate 320 and the third transmission gate 325, and gate terminals of the p-type FETs 319 and 324 of, respectively, the first transmission gate 315 and the fourth transmission gate 330 are coupled with the second LO signal terminal 350. Such a configuration provides for the transmission gates of each stage in a circuit path (e.g. 315 and 325) to operate substantially 180 out of phase with each other.

For the mixer 300, the first base band signal terminal 355 is coupled with the drain terminals of the n-type FETs (317 and 322) and the p-type FETs (319 and 324) of the first and second transmission gates (315 and 320). Likewise, the second base band signal terminal 360 is coupled with the drain terminals of the n-type FETs (327 and 332) and the p-type FETs (329 and 334) of the third and fourth transmission gates (325 and 330).

A mixer circuit having the configuration of mixer 300 provides certain performance advantages over prior mixer circuits, such as the mixer 100 shown in FIG. 1. In this regard, the use of the CMOS transmission gates results in improved linearity of the mixer 300 over such prior circuits. This improved linearity results, at least in part, from the relative resistance characteristics of the n-type FET and p-type FET of each transmission gate.

Looking specifically at a single transmission gate, the first transmission gate 315, for signals (e.g., mixed signals or base band signals) that have relatively low amplitudes, the n-type FET 317 will have a low channel resistance due to the relatively high $V_{gs}$ present when the LO signal is high. Conversely, the p-type FET 319 will have a relatively high channel resistance in this situation. As the signal amplitude (mixed signal or base band) increases, the $V_{gs}$ of the n-type FET 317 likewise decreases, causing a corresponding increase in the channel resistance. However, in this situation, the channel resistance of the P-type FET 319 will decrease, allowing the signals being processed by the mixer 300 to be readily conducted through the transmission gate over a larger range of signal amplitudes. Therefore, the linearity of the mixer 300 is improved, which results in an increase in the 1-db compression point and the IP3 point of the mixer 300 over prior approaches.

Also, the mixer 300 may be implemented on an integrated circuit, such that the first, second, third and fourth transmission gates (315, 320, 325 and 330) are substantially physically symmetric. Further, the first and second transmission gates (315 and 320) may be implemented so as to have the same orientation with respect to each other, while the third and fourth transmission gates (325 and 330) also have the same orientation with respect to each other. Such an arrangement may provide additional advantages over other techniques, such as those using discrete components. In this regard, such a configuration would reduce the amount of LO signal feedthrough. Such LO signal feedthrough results, at least in part, from mismatch (e.g. differences in electrical characteristics) in the transistors used to implement such a mixer circuit. Therefore, because such transistors will be closely matched, implementing the mixer 300 in the above-described fashion will reduce mismatches over other possible techniques.

Figure 4:
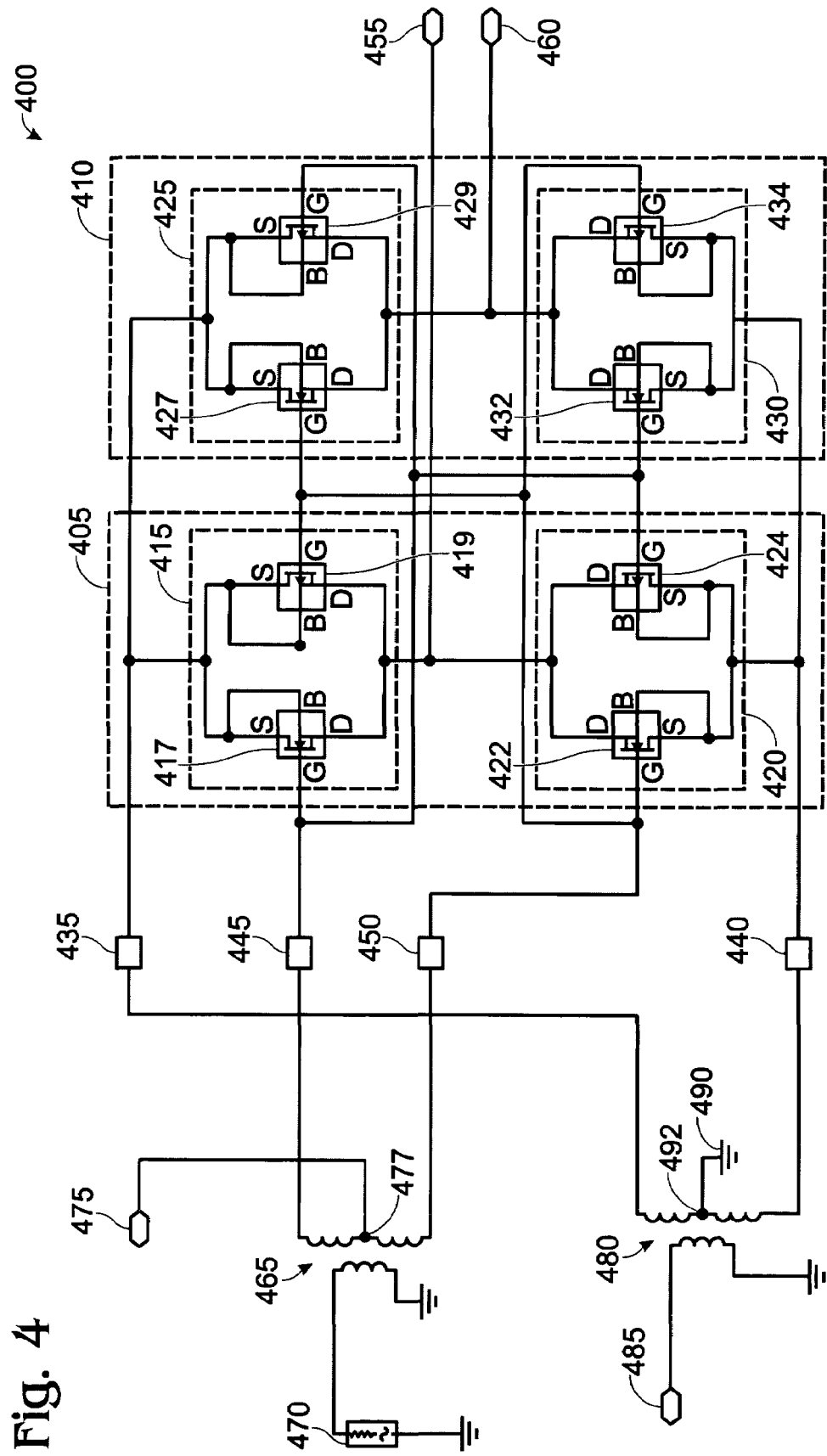
FIG. 4 is a schematic diagram of yet another mixer circuit in accordance with yet another embodiment of the invention.

Referring now to FIG. 4, a schematic diagram of a mixer circuit 400 in accordance with yet another embodiment of the invention is shown. The mixer circuit 400 may be implemented in a number of fashions. For example, the mixer 400 may be implemented as an "up-converter" used to mix a base band signal with a LO signal to generate a single-ended mixed signal. The mixer 400 may also be implemented as a "down-converter" to receive a single-ended mixed signal, convert that single-ended mixed signal to a differential mixed signal and then extract a base band signal from the differential mixed signal.

In a similar fashion as with the mixer 300, the mixer 400 shown in FIG. 4 contains analogous elements to the mixers 200 and 300 shown in, respectively, FIG. 2 and FIG. 3. These elements have reference numbers 405–460 that correspond with the reference numbers 205–260 of FIG. 2 and 305–360 of FIG. 3. Again, for the sake of brevity, these analogous elements will not be discussed in detail with respect to FIG. 4. Also, it will, of course, be appreciated that the invention is not limited to the particular embodiments shown in these Figures and described herein, and any number of alternative embodiments within the scope of the appended claims may exist.

The mixer 400 comprises a first balanced-unbalanced device (balun) 465. The first balun 465 comprises a transformer and is coupled with a LO circuit 470, which may generate an RF signal for up-converting or down-converting mixed signals, as has been previously described. The LO signal produced by the LO circuit 470 is an RF range single-ended signal that is then communicated to the first balun 465. The first balun 465 is further coupled with a voltage reference terminal 475 via a center tap 477 in one coil of the first balun 465. By applying an appropriate voltage to the voltage reference terminal 475, the single-ended LO signal may be converted to a differential LO signal by the first balun 465. The differential LO signal may then be communicated to the mixer 400 via the LO signal terminals 445 and 450. The mixer 400 may then use the differential LO signal to up-convert or down-convert signals as has been previously described.

The mixer circuit 400 also comprises a second balun 480 that is coupled with a single-ended mixed signal terminal 485. The second balun 480 is also coupled with a ground voltage reference 490 via a center tap 492. With this configuration, the mixer 400 may receive a mixed signal (e.g. RF signal) that is single-ended (via the signal terminal 485) and convert that single-ended mixed signal to a differential mixed signal that is communicated to the mixer 400 for down-conversion. Alternatively, the mixer 400 may communicate a differential mixed signal to the second balun 480, which the balun then converts to a single-ended mixed signal that is communicated external to the mixer 400 via the signal terminal 485.

As was just described, the mixer circuits 200, 300 and 400 may be used both for up-converting and down-converting various types of signals. These mixer circuits have certain advantages over prior circuits due to the increased linearity of the mixer stages. Such circuits are also advantageous, as a single circuit design may be used for both receivers and transmitters in a single integrated circuit (single-chip) radio. Such a single-chip radio may then be used as a transceiver in, for example, handheld two-way radios, though numerous other applications for such mixer circuits exist.

While certain features of the invention have been illustrated and described herein, many modifications, substitutions, changes and equivalents will now occur to those skilled in the art. It is, therefore, to be understood that the appended claims are intended to cover all such modifications and changes as fall within the true spirit of the invention.

What is claimed is:

1. A mixer circuit comprising:
a first mixer stage comprising a first transmission gate and a second transmission gate, wherein the first transmission gate includes complementary transistors and is coupled with a first mixed signal terminal and first and second local oscillator (LO) signal terminals, and the second transmission gate includes complementary transistors and is coupled with a second mixed signal terminal and the first and second LO signal terminals;
a second mixer stage comprising a third transmission gate and a fourth transmission gate, wherein the third transmission gate includes complementary transistors and is coupled, with the first transmission gate, the first mixed signal terminal and the first and second LO signal terminals so as to operate out of phase with the first transmission gate, and the fourth transmission gate includes complementary transistors and is coupled with the third transmission gate, the second mixed signal terminal and the first and second LO signal terminals so as to operate out of phase with the second transmission gate;
a first base band signal terminal coupled with the first and second transmission gates; and
a second base band signal terminal coupled with the third and fourth transmission gates;
wherein the mixer circuit processes signals so as to provide for at least one of:
mixing a first base band signal communicated to the first and second base band signal terminals with a differential LO signal communicated to the first and second LO signal terminals to create a first mixed signal; and
extracting a second base band signal from a second mixed signal communicated to the first and second mixed signal terminals using the LO signal communicated to the first and second LO signal terminals.

2. The mixer circuit of claim 1, wherein the first, second, third and fourth transmission gates comprise CMOS transmission gates each having an n-type field-effect transistor (FET) having a source terminal and a drain terminal coupled, respectively, with a source terminal and a drain terminal of a p-type FET.

3. The mixer circuit of claim 2, wherein source terminals of the n-type and p-type transistors of the first and third transmission gates are coupled with the first mixed signal terminal and source terminals of the n-type and p-type transistors of the second and fourth transmission gates are coupled with the second mixed signal terminal.

4. The mixer circuit of claim 3, wherein gate terminals of the n-type FETs of the first and fourth transmission gates and gate terminals of the p-type FETs of the second and third transmission gates are coupled with the first LO signal terminal; and
gate terminals of the n-type FETs of the second and third transmission gates and gate terminals of the p-type FETs of the first and fourth transmission gates are coupled with the second LO signal terminal.

5. The mixer circuit of claim 2, wherein drain terminals of the n-type and p-type transistors of the first and second transmission gates are coupled with the first base band signal terminal and drain terminals of the n-type and p-type transistors of the third and fourth transmission gates are coupled with the second base band signal terminal.

6. The mixer circuit of claim 1, wherein the circuit is embodied on an integrated circuit such that the first, second, third and fourth transmission gates are substantially physically symmetric with the first and second transmission gates having the same orientation with respect to each other and the third and fourth transmission gates having the same orientation with respect to each other.

7. The mixer circuit of claim 6, wherein the integrated circuit comprises a complementary metal-oxide semiconductor integrated circuit.

8. The mixer circuit of claim 1, further comprising a balanced-unbalanced device coupled with a LO circuit and the first and second LO signal terminals.

9. The mixer circuit of claim 1, further comprising a balanced-unbalanced device coupled with a single-ended mixed signal terminal and the first and second mixed signal terminals.

10. The mixer of claim 9, wherein the single-ended mixed signal terminal receives the second mixed signal from an external mixed signal source.

11. The mixer of claim 9, wherein the first mixed signal is communicated to a remote receiver via the single-ended mixed signal terminal.

12. A mixer circuit comprising:
a first balanced-unbalanced device coupled with an oscillator circuit, the first balanced-unbalanced device being further coupled with a reference voltage signal and first and second local oscillator (LO) signal terminals;
a second balanced-unbalanced device coupled with a single-ended mixed signal terminal and further coupled with first and second differential mixed signal terminals, the second balanced-unbalanced device being still further coupled with a ground voltage reference;
a first mixer stage comprising a first transmission gate and a second transmission gate, wherein the first transmission gate is coupled with the first differential mixed signal terminal and the first and second local oscillator (LO) signal terminals, and the second transmission gate is coupled with the second differential mixed signal terminal and the first and second LO signal terminals;
a second mixer stage comprising a third transmission gate and a fourth transmission gate, wherein the third transmission gate is coupled with the first differential mixed signal terminal and the first and second LO signal terminals so as to operate out of phase with the first transmission gate, and the fourth transmission gate is coupled with the second differential mixed signal terminal and the first and second LO signal terminals so as to operate out of phase with the second transmission gate; and
a first base band signal terminal coupled with the first and second transmission gates; and
a second base band signal terminal coupled with the third and fourth transmission gates.

13. The mixer circuit of claim 12, wherein the first and second base band signal terminals comprise first and second base band input signal terminals, such that a base band signal communicated to the first and second base band input signal terminals is mixed with a differential LO signal communicated from the oscillator circuit to the first and second LO signal terminals via the first balanced-unbalanced device to generate a differential mixed signal, which is communicated to the second balanced-unbalanced device to generate a single-ended mixed signal.

14. The mixer circuit of claim 12, wherein the single-ended mixed signal terminal comprises a single-ended mixed input signal terminal, such that a differential mixed signal is generated as a result of a single-ended mixed signal being communicated to the second balanced-unbalanced device via the singled-ended mixed input signal terminal, wherein the differential mixed signal is communicated to the first and second mixed signal terminals from the second balanced and unbalanced device, and wherein the differential mixed signal is processed by the first and second mixer stages to extract a differential base band signal from the differential mixed signal using a differential LO signal communicated from the oscillator circuit to the first and second LO signal terminals via the first balanced-unbalanced device.

15. The mixer circuit of claim 12, wherein the first, second, third and fourth transmission gates comprise CMOS transmission gates each having an n-type field-effect transistor (FET) having a source terminal and a drain terminal coupled, respectively, with a source terminal and a drain terminal of a p-type FET.

16. The mixer circuit of claim 15, wherein source terminals of the n-type and p-type transistors of the first and third transmission gates are coupled with the first mixed signal terminal and source terminals of the n-type and p-type transistors of the second and fourth transmission gates are coupled with the second mixed signal terminal.

17. The mixer circuit of claim 15, wherein gate terminals of the n-type FETs of the first and fourth transmission gates and gate terminals of the p-type FETs of the second and third transmission gates are coupled with the first LO signal terminal; and gate terminals of the n-type FETs of the second and third transmission gates and gate terminals of the p-type FETs of the first and fourth transmission gates are coupled with the second LO signal terminal.

18. The mixer circuit of claim 15, wherein drain terminals of the n-type and p-type transistors of the first and second transmission gates are coupled with the first base band signal terminal and drain terminals of the n-type and p-type transistors of the third and fourth transmission gates are coupled with the second base band signal terminal.

19. The mixer circuit of claim 12, wherein the circuit is embodied on an integrated circuit such that the first, second, third and fourth transmission gates are substantially physically symmetric with the first and second transmission gates having the same orientation with respect to each other and the third and fourth transmission gates having the same orientation with respect to each other.

20. The mixer circuit of claim 19, wherein the integrated circuit comprises a complementary metal-oxide semiconductor integrated circuit.

21. The mixer circuit of claim 20, wherein the first and second balanced-unbalanced devices each comprise a transformer wherein at least one coil of each transformer comprises a center tap for applying a voltage reference.

22. In a differential mixer circuit comprising a first mixer stage having first and second signal paths coupled with first and second mixed signal terminals and first and second local oscillator (LO) signal terminals; a second mixer stage having first and second signal paths coupled with the first and second mixed signal terminals and the first and second LO signal terminals so as to operate out of phase with the first mixer stage; a first base band signal terminal coupled with the first mixer stage; and a second base band signal terminal coupled with the second mixer stage, an improvement comprising:

implementing the first and second mixer stages using a signal-path circuit, wherein the signal-path circuit implementing each signal path for each mixer stage comprises at least a first device and a second device, the first device and the second device being complementary to each other, wherein the first device, having a first set of resistance characteristics, is coupled with the second device, having a second set of resistance characteristics, the first and second resistance characteristics being inversely related to one another, thereby increasing a linear operation range of the mixer circuit and raising a one decibel compression point of the mixer circuit.

23. The mixer circuit of claim 22, wherein each signal-path circuit implementing the first and second signal paths of the first and second mixer stages comprises a transmission gate.

24. The mixer circuit of claim 23, wherein each transmission gate comprises a CMOS transmission gate comprising an n-type field-effect transistor (FET) having a source terminal and a drain terminal coupled, respectively, with a source terminal and a drain terminal of a p-type FET.

25. The mixer circuit of claim 24, wherein the source terminals of the n-type and p-type transistors of a first transmission gate of the first mixer stage and a first transmission gate of the second mixer stage are coupled with the first mixed signal terminal and source terminals of the n-type and p-type transistors of a second transmission gate of the first mixer stage and a second transmission gate of the second mixer stage are coupled with the second mixed signal terminal.

26. The mixer circuit of claim 24, wherein gate terminals of the n-type FETs of the first transmission gate of the first mixer stage and the second transmission gate of the second mixer stage and gate terminals of the p-type FETs of the second transmission gate of the first mixer stage and the first transmission gate of the second mixer stage are coupled with the first LO signal terminal; and gate terminals of the n-type FETs of the second transmission gate of the first mixer stage and the first transmission gate of the second mixer stage and gate terminals of the p-type FETs of the first transmission gate of the first mixer stage and the second transmission gate of the second mixer stage are coupled with the second LO signal terminal.

27. The mixer circuit of claim 24, wherein drain terminals of the n-type and p-type transistors of the first mixer stage are coupled with the first base band signal terminal and drain terminals of the n-type and p-type transistors of the second mixer stage are coupled with the second base band signal terminal.

28. The mixer circuit of claim 22, wherein the circuit is embodied on an integrated circuit.

* * * * *